United States Patent [19]

Weir

[11] 4,020,365
[45] Apr. 26, 1977

[54] INTEGRATED FIELD-EFFECT TRANSISTOR SWITCH

[75] Inventor: Basil Weir, San Jose, Calif.

[73] Assignee: Intersil Incorporated, Cupertino, Calif.

[22] Filed: Mar. 22, 1976

[21] Appl. No.: 669,395

[52] U.S. Cl. .............................. 307/251; 307/304; 357/22; 357/41
[51] Int. Cl.² ................ H03K 17/04; H03K 17/60; H01L 29/80; H01L 27/04
[58] Field of Search ............. 307/251, 304; 357/22, 357/41

[56] References Cited
UNITED STATES PATENTS

| | | | |
|---|---|---|---|
| 3,414,737 | 12/1968 | Bowers, Jr. ................... | 307/251 X |
| 3,414,782 | 12/1968 | Lin et al. ...................... | 357/22 |
| 3,456,166 | 7/1969 | Lelty ............................. | 307/251 X |
| 3,740,581 | 6/1973 | Pfiffner ......................... | 307/251 |
| 3,916,222 | 10/1975 | Compton ....................... | 307/251 |
| 3,955,103 | 5/1976 | Russell et al. ................. | 307/251 |

*Primary Examiner*—John S. Heyman
*Assistant Examiner*—Larry N. Anagnos
*Attorney, Agent, or Firm*—Gregg, Hendricson, Caplan & Becker

[57] ABSTRACT

A monolithic switching circuit has a junction field-effect transistor controlled through a capacitive diode and a small field-effect transistor. The physical structure of the switch includes a junction field-effect transistor with a gate region connected to one side of a diode and to the gate of another small field-effect transistor having the source thereof connected to or comprising the other side of the diode and the drain thereof connected to a control terminal.

5 Claims, 5 Drawing Figures

U.S. Patent      April 26, 1977      4,020,365
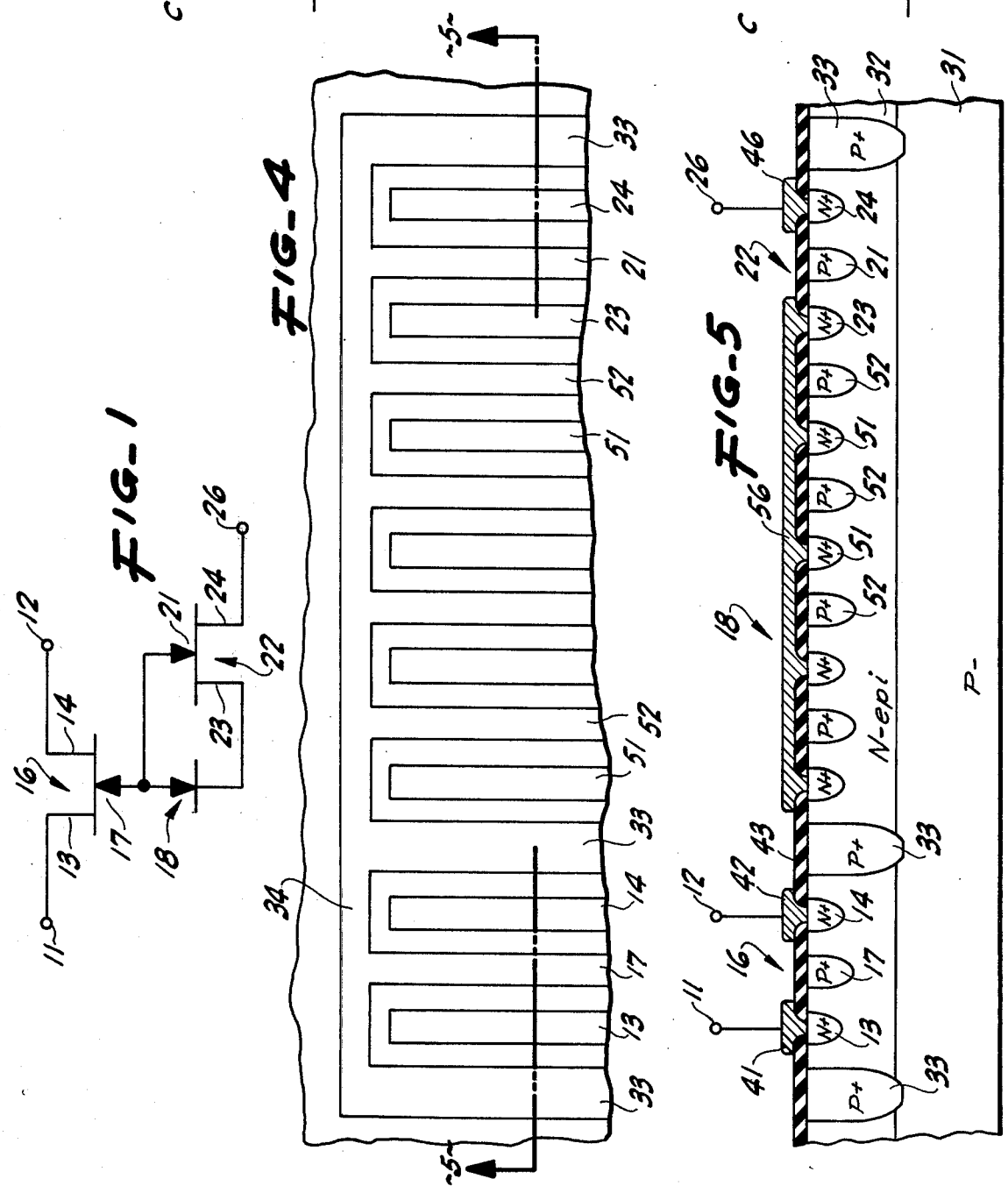

INTEGRATED FIELD-EFFECT TRANSISTOR SWITCH

BACKGROUND OF INVENTION

The present invention is related to integrated circuits in general and, in particular, to a monolithic integrated circuit device or switch comprising means forming a capacitive diode and a small field-effect transistor connected to the gate of a switching junction field-effect transistor (junction FET or JFET).

The N-channel junction FET having, for example, the UN5001B geometry, has long been a very popular device for use in solid state (analog gate) switching. It has a low drain-source switch resistance, $R_{DS(ON)}$, as of the order of 40 ohms, coupled with a low pinch-off voltage $V_p$, as of the order of 2.5 volts. The low $V_p$ allows a user to switch signals of ±10 volts with a ±15 volt power supply and still have at least a volt of margin so that with $V_p \leq 4$ volts, up to ±11 volts can be switched with ±15 volts. The limiting parameter on the signals that can be effectively handled is $V_p$. This is due to the fact that gate voltage must exceed (in a negative direction) source or drain voltage by $V_p$, or the switch will not turn off. Thus, if −10 volts is the input signal, and $V_p = 4$ volts, gate voltage must be at least −14 volts.

While the UN5001B or equivalent has characteristics that are favorable for use in switching, the fact that it is an N-channel depletion mode device means that a driver circuit must be used to translate positive logic (i.e., TTL, DTL, RTL) into voltages required to drive the FET. This normally means a +3 volts to +15 volts translation and a 0 volt to −15 volts translation.

Because of the voltage translation required, some sort of isolator is also required between the translator and the output of the FET so that the source to gate junction (or drain to gate junction) of the FET will not be forward biased during switching. This isolator is usually provided as a separate diode in parallel with a separate capacitor or a diode in conjunction with a gate to source referral resistor. The diode may be of the simple type with a gradual curve of decreasing junction capacitance or of the "pinch"-type where the capacitance decreases gradually until the pinch voltage is reached at which point the capacitance decreases very rapidly with further increase of voltage.

In addition to being inherently more costly because of the time and expense of manufacturing separate parts and then having to assemble the parts, the prior known hybrid circuit devices are also subject to the possibility of reduced performance due to current leakage associated generally with external connections.

SUMMARY OF INVENTION

The present invention comprises an integrated circuit JFET having the gate thereof connected to a control terminal through a diode and a small field-effect transistor, all formed in a single die as a unitary switching element.

The switch of the present invention has a capacitance diode in parallel with the gate-source terminals of a small field-effect transistor which, in turn, has the gate-drain terminals thereof disposed between the gate of a field-effect switching transistor and a control terminal. With the foregoing integrated circuit arrangement, very rapid switching may be achieved because the charge on the diode is removed through the channel of the small FET so that the time constant (RC) is very small. This compares favorably with the time constant of a pinch diode of equal capacitance due to the larger distributed resistance inherent in a pinch diode. Additionally the switch hereof has a high ac peak to peak voltage switching capability because the capacitance in the off condition becomes the drain capacitance of the small FET, which is very small. This compares favorably with the off-capacitance of a pinch diode which is also very small.

The physical structure of the present invention is quite simple in that only conventional integrated circuit techniques are employed and all operative regions of the invention may be diffused into an epitaxial layer, for example. A complete field-effect configuration may be employed with the diode having a field-effect transistor configuration with multiple sources and drains being respectively connected, the small FET having a source which is the diode cathode and the FET switch having the source and drain regions thereof separated by isolation from the diode and small FET.

DESCRIPTION OF FIGURES

The present invention is illustrated as to a preferred embodiment thereof in the accompanying drawings wherein:

FIG. 1 is a circuit diagram of the present invention;

FIG. 2 is a curve of voltage versus capacitance for the diode of the present invention;

FIG. 3 is a curve of voltage versus capacitance for the combination of diode and small FET of the present invention;

FIG. 4 is a partial plan view of an integrated circuit device constructed in accordance with the present invention with the insulating layer and metal contacts removed; and FIG. 5 is a transverse sectional view taken in the plane 5 — 5 of FIG. 4.

DESCRIPTION OF PREFERRED EMBODIMENT

There is illustrated in FIG. 1 of the drawings are electrical circuit of the present invention and referring thereto there will be seen to be provided a pair of switch contacts 11 and 12 connected to the source 13 and drain 14 of a switching JFET 16. The gate 17 of JFET 16 is electrically connected to the anode of a diode 18 and is also connected to the gate 21 of a small FET 22. The source 23 of the small FET 22 is connected to the cathode of the diode 18 and the drain 24 of this small FET is connected to a control terminal 26. In accordance with the present invention the foregoing circuit is formed as a monolithic unit, i.e., an integrated circuit in a single die of semiconducting material.

The small signal capacitance of the diode 18 varies with voltage, as indicated in FIG. 2. In FIG. 3 there is illustrated the variation of small signal capacitance with voltage for the combination of diode 18 and small FET 22. The capacitance-voltage curve for small voltages is the same in FIG. 3 as in FIG. 2; however, at the pinch-off voltage ($V_p$) of FET 22 the small signal capacitance drops off to substantially zero. This characteristic is highly advantageous in reducing the switching time of the device and it is furthermore noted that the RC time constant is minimized by the structure of the present invention. The series resistance joining the distributed capacitance of the diode to the negative terminal or control terminal 26 is herein minimized in that such resistance is the resistance of the FET channel which is extremely short. Thus, the charging and discharging times of the diode are reduced.

The physical structure of a preferred embodiment of the present invention is illustrated in FIGS. 4 and 5 and it will be noted with reference thereto that fabrication hereof is simplified and that no diffusion is required before formation of the epitaxial layer. Referring now to the above-noted figures there will be seen to be provided a P-type substrate 31 upon which there is formed an N- epitaxial layer 32. In the upper surface of the epitaxial layer there are formed various regions, as described below, and separated by P+ isolation channels 33 and 34 extending through the epitaxial layer from the upper surface thereof into the substrate 31. The JFET 16 is shown at the left of FIGS. 4 and 5 as comprising N+ type source and drain regions 13 and 14, respectively, disposed on opposite sides of a P+ gate region 17. These regions 13, 14 and 17 may be formed by diffusion into the upper surface of the epitaxial layer 32 in conventional manner and electrical connections 41 and 42 are shown to be provided in extension through an insulating layer 43 over the top of the device into ohmic contact with the regions 13 and 14, respectively. These electrical contacts 41 and 42 comprise or are connected to the switch terminals 11 and 12, respectively. Region 31 comprises the bottom gate of the JFET 16, the bottom gate of JFET 22 and the anode of diode 18. The N- region of JFET 16 is surrounded by isolation channels 33 and 34 and is thus electrically isolated from the N-type regions of JFET 22 and diode 18, which are also surrounded by the isolation channels 33 and 34.

All P- type gates 17, 52 and 21 are electrically connected to the P- type substrate 31 inasmuch as they all intersect at their ends with the isolation channels 33 and 34 which extend into connection with the substrate 31. It will thus be seen that the gates of JFETS 16 and 22 and the anode of diode 18 are internally connected, in accordance with FIG. 1. It is noted that FIG. 4 illustrates the structure of the present invention without the insulating layer and electrical contacts thereon in order to clearly identify the relationship of diffused regions hereof.

At the right of FIGS. 4 and 5 there is illustrated a small FET 22 having N+ source and drain regions 23 and 24, respectively disposed on opposite sides of a P+ gate region 21. These regions may be formed by diffusion into the upper surface of the epitaxial layer in conventional manner. An electrical contact 46 is shown to extend through an opening in the insulating layer 43 into ohmic contact with the drain region 24 and this contact forms or is connected to the control terminal 26.

In accordance with the present invention, the source region 23 of FET 22 comprises a portion of the cathode of the diode 18 which is illustrated in FIGS. 4 and 5 to be formed with a field-effect transistor configuration having a plurality of additional N+ cathode regions 51 interleaved with P+ anode regions 52. The P+ anode regions are all connected together to the isolation channel 34 which connects to the substrate 31. The N+ cathode regions of the diode are all electrically connected together as by a metallic interconnect 56. It is noted that no external electrical connections are made to either anode or cathode of the diode 18 as only internal integrated circuit connections are required.

In addition to the physical structure described above in connection with FIGS. 4 and 5, it is noted that the gate region 17 of JFET 16 is electrically connected to the isolation channel 34 which also connects the diode anode regions 52. This will be seen to complete the electrical connections illustrated in the circuit of FIG. 1 described above. The diode 18 of the present invention is illustrated in FIGS. 4 and 5 as being formed as a multiple FET which may be advantageous from the viewpoint of fabrication of the present device; however, it will be appreciated that this diode may be alternatively fabricated in accordance with integrated circuit techniques.

The present invention, as described above in connection with a single preferred embodiment thereof, has substantial advantages over prior art structures and reference is particularly made to the following advantages in comparison to a JFET and diode drive construction. The structure of the present invention provides for smaller or lower time constants so as to accommodate more rapid switching by the device hereof. The present invention has a very simple fabrication technique all in accordance with generally accepted manners of fabricating integrated circuits. Although not particularly commented upon above, it is believed apparent that the structure of the present invention has less problems of leakage because of the reduced amplification factor of possible parasitic NPN transistor action within the structure. In addition it is noted that the present invention provides the capability of controlling the pinch-off voltage ($V_p$) of the diode hereof by means of controlling the dimensions of the gate of the small FET of this device.

Although the present invention has been described with respect to a particular preferred embodiment thereof, it will be appreciated by those skilled in the art that numerous modifications and variations may be made within the scope of the present invention and thus it is not intended to limit the invention by the precise terms of description nor details of illustration.

What is claimed is:

1. An improved monolithic electronic switch comprising
    a junction field-effect transistor having source, drain and gate regions disposed in a single die of semiconducting material,
    switch terminals electrically connected to the source and drain regions of said junction field-effect transistor,
    a semiconductor diode formed in said single die adjacent said junction field-effect transistor and having an anode region connected to the gate region of said junction field-effect transistor within said die, and
    a small field-effect transistor having source, drain and gate regions disposed in said same single die with said source thereof comprising at least a portion of a cathode region of said diode, said gate being connected to the gate region of said junction field-effect transistor and said drain thereof having an external electrical connection for receiving signals to control conduction of said junction field-effect transistor.

2. The electronic switch of claim 1 further defined by said diode comprising a plurality of interleaved and separated N and P type regions with all regions of a first conductivity type being connected together in said die and all regions of the second conductivity type being electrically connected together by metal connections.

3. The electronic switch of claim 1 further defined by said small field-effect transistor having a very short channel to minimize the resistance thereof whereby the switch has low time constants for rapid switching and also having a very small drain-to-gate capacitance resulting in a very good capability of the switch to transmit signals of high peak to peak voltage.

4. An integrated circuit field-effect switch comprising in a single die
   a junction field-effect transistor having source, gate and drain regions;
   switch terminals connected to said source and drain regions;
   a diode having a first side thereof connected to the gate of said junction field-effect transistor in said die;
   a small second field-effect transistor having a source region comprising at least a portion of a second side of said diode, a gate region connected to the first side of said diode in said die and a drain region; and
   a control terminal connected to the drain region of said second small field-effect transistor
   whereby the switch passes signals between said switch terminals as controlled by signals applied to said control terminal.

5. An improved integrated circuit field-effect switch comprising
   a semiconducting substrate of a first conductivity type;
   a semiconducting layer of a second conductivity type disposed upon said substrate and separated therefrom by a P-N junction;
   a first field-effect transistor source and drain regions of a second conductivity type on opposite sides of a gate region of a first conductivity type with said regions extending into the upper surface of said layer;
   a first isolation channel of first conductivity type extending through said layer from the top thereof into said substrate about said first field-effect transistor and contacting said source and drain regions at adjacent ends thereof;
   a small second field-effect transistor having source and drain regions of a second conductivity type extending into the upper surface of said layer and a gate region of a first conductivity type extending into the upper surface of said layer between said source and drain regions;
   a second isolation channel disposed about said second field-effect transistor and extending through said layer from the upper surface thereof into said substrate and contacting the gate region of said second field-effect transistor, with said first and second isolation channels being connected;
   a diode including at least one first region of first conductivity type extending into said layer from the upper surface thereof and the source region of said second field-effect transistor disposed inside of the boundaries of said second isolation channel; and
   electrical contacts to the drain of said second fieldeffect transistor and to the drain and source of said first fieldeffect transistor whereby conduction between the contacts to the source and drain of said first field-effect transistor is controlled by signals applied to the contact to the drain of said second field-effect transistor.

* * * * *